United States Patent
Peng et al.

(10) Patent No.: US 9,721,887 B2
(45) Date of Patent: Aug. 1, 2017

(54) METHOD OF FORMING METAL INTERCONNECTION

(71) Applicant: Taiwan Semiconductor Manufacturing Company, Ltd., Hsin-Chu (TW)

(72) Inventors: Chao-Hsien Peng, Hsinchu County (TW); Chih Wei Lu, Hsinchu (TW); Ming-Han Lee, Taipei (TW); Shau-Lin Shue, Hsinchu (TW)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 0 days.

(21) Appl. No.: 14/829,959

(22) Filed: Aug. 19, 2015

(65) Prior Publication Data
US 2017/0053864 A1    Feb. 23, 2017

(51) Int. Cl.
| | |
|---|---|
| *H01L 21/4763* | (2006.01) |
| *H01L 23/528* | (2006.01) |
| *H01L 21/768* | (2006.01) |
| *H01L 23/522* | (2006.01) |
| *H01L 23/532* | (2006.01) |

(52) U.S. Cl.
CPC ...... *H01L 23/528* (2013.01); *H01L 21/76816* (2013.01); *H01L 21/76843* (2013.01); *H01L 21/76856* (2013.01); *H01L 21/76865* (2013.01); *H01L 21/76879* (2013.01); *H01L 23/5226* (2013.01); *H01L 23/53238* (2013.01)

(58) Field of Classification Search
CPC ......... H01L 2924/0002; H01L 2924/00; H01L 21/76846; H01L 23/53238; H01L 21/76831; H01L 21/76843; H01L 21/76807; H01L 21/76814; H01L 21/76826; H01L 23/5226; H01L 21/76805; H01L 21/76834; H01L 21/76849; H01L 23/5329
See application file for complete search history.

(56) References Cited

U.S. PATENT DOCUMENTS

| | | | | |
|---|---|---|---|---|
| 6,627,557 | B2 * | 9/2003 | Seta | H01L 21/28123 257/E21.206 |
| 6,972,253 | B2 * | 12/2005 | Liu | H01L 21/76801 257/E21.576 |
| 7,667,271 | B2 | 2/2010 | Yu et al. | |

(Continued)

FOREIGN PATENT DOCUMENTS

TW      201025503      7/2010

*Primary Examiner* — Bradley L Smith
*Assistant Examiner* — David Goodwin
(74) *Attorney, Agent, or Firm* — Haynes and Boone, LLP

(57) ABSTRACT

A method of fabricating a semiconductor device is disclosed. The method includes forming a dielectric layer over a substrate, forming a trench in the dielectric layer, forming a first barrier layer in the trench. The first barrier layer has a first portion disposed along sidewalls of the trench and a second portion disposed over a bottom of the trench. The method also includes applying an anisotropic plasma treatment to convert the second portion of the first barrier layer into a second barrier layer, removing the second barrier layer while the first portion of the first barrier layer is disposed along sidewalls of the trench. The method also includes forming a conductive feature in the trench.

18 Claims, 14 Drawing Sheets

(56) References Cited

U.S. PATENT DOCUMENTS

| | | | |
|---|---|---|---|
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2005/0051900 A1* | 3/2005 | Liu | H01L 21/76801 257/757 |
| 2005/0184295 A1* | 8/2005 | Huang | H01L 21/76801 257/77 |
| 2014/0001574 A1 | 1/2014 | Chen et al. | |
| 2014/0110755 A1 | 4/2014 | Colinge | |
| 2014/0151812 A1 | 6/2014 | Liaw | |
| 2016/0118296 A1* | 4/2016 | Kolics | H01L 21/76879 438/653 |

\* cited by examiner

METHOD OF FORMING METAL INTERCONNECTION

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, there are many challenges associated with developing robust processes for forming metal interconnections with low resistance.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
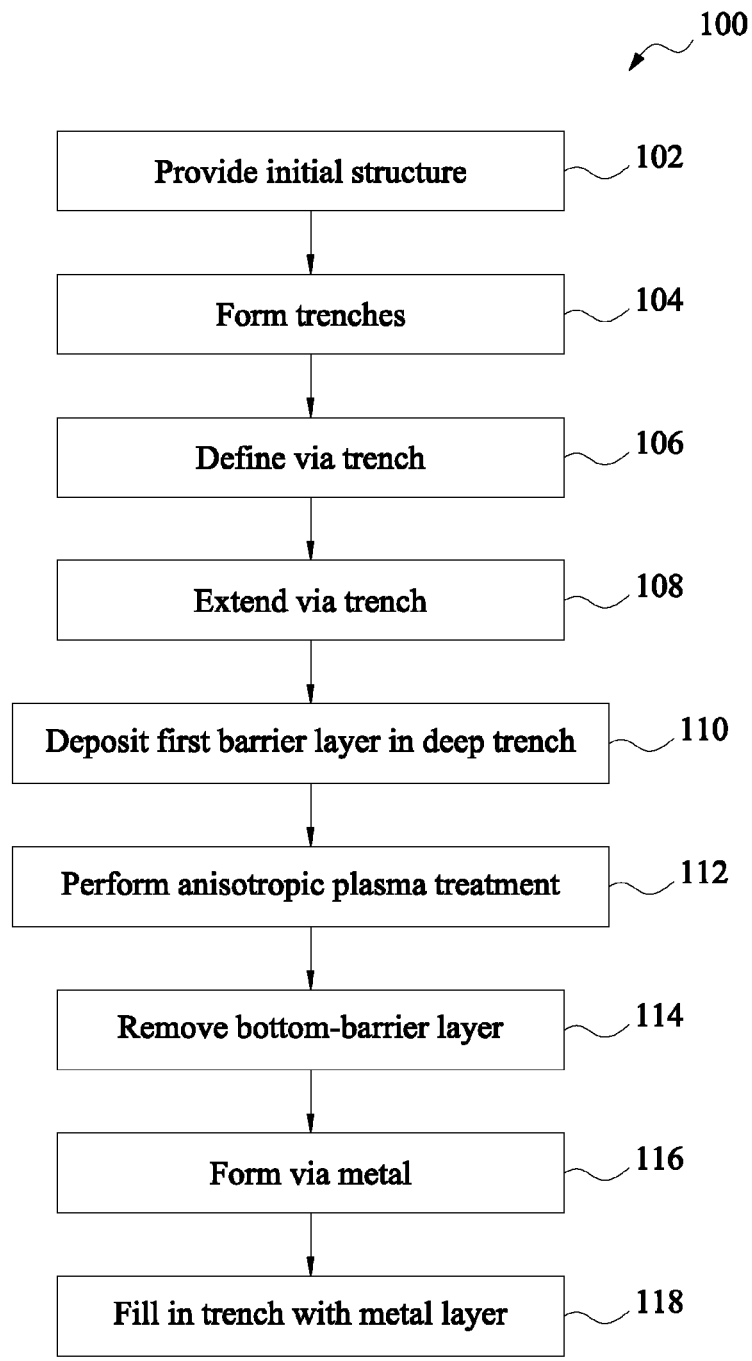
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to an initial structure 205 of a semiconductor device 200 showed in FIG. 2 and the semiconductor device 200 shown in FIGS. 3, 4, 5A, 5B, 6, 7, 8, 9, 10A, 10B, 11 and 12.

Figure 2:
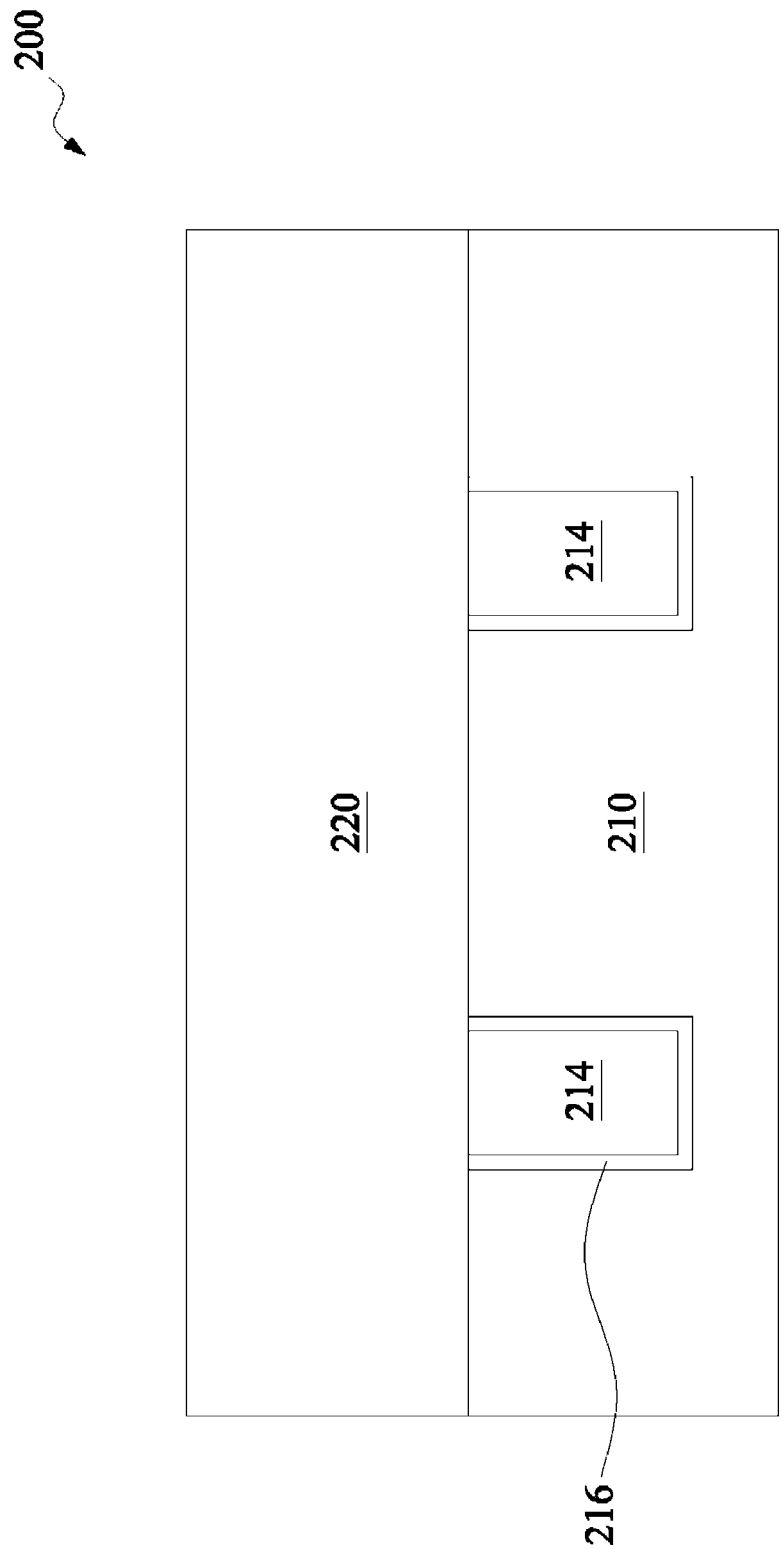
FIG. 2 is a cross-sectional view of an exemplary initial structure of a semiconductor device in accordance with some embodiments.

Referring to FIGS. 1 and 2, the method 100 starts at step 102 by providing the initial structure 205. The initial structure 205 includes a substrate 210, which may include silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate. The substrate 210 may further include lateral isolation features provided to separate various devices formed in the substrate 210. In one embodiment, shallow trench isolation (STI) features are used for lateral isolation. The various IC devices may further include other features, such as silicide disposed on S/D and gate stacks overlying channels.

The initial structure 205 may also include a plurality of dielectric layers and conductive features integrated to form an interconnect structure configured to couple the various p-type and n-type doped regions and the other functional features (such as gate electrodes), resulting a functional integrated circuit. In one example, the initial structure 205 may include a portion of the interconnect structure and is collectively referred to as the substrate 210. The interconnect structure is further described later.

As noted above, the substrate 210 includes an interconnect structure. The interconnect structure includes a multi-layer interconnect (MLI) structure and an inter-level dielectric (ILD) integrated with the MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 214 are shown in FIG. 2 for illustration. In one embodiment, the conductive features 214 include a portion of the interconnect structure. For example, the conductive feature 214 includes a contact, a metal via, and/or a metal line. The conductive feature 214 may include aluminum (Al), copper (Cu), and/or tungsten (W). In another embodiment, the conductive feature 214 includes an electrode of a capacitor, a resistor or a portion of a resistor. Alternatively, the conductive features 214 include a doped region (such as a source or a drain), or a gate electrode. In another example, the conductive features 214 are silicide features disposed on respective source, drain or gate electrode. The silicide feature may be formed by a self-aligned silicide (salicide) technique.

In some embodiments, the conductive features 214 may be further surrounded by a barrier layer 216 to prevent diffusion and/or provide material adhesion. The barrier layer 216 may include titanium nitride (TiN), tantalum nitride (TaN), tungsten nitride (WN), titanium silicon nitride (TiSiN), and/or tantalum silicon nitride (TaSiN). The conductive features 214 and the barrier layer 216 may be formed by a procedure including lithography, etching and deposition. An example lithography process may include coating, exposure, post exposure baking, and developing processes. The etch process may include a wet etch, a dry etch, and/or a combination thereof. The deposition technique may include physical vapor deposition (PVD), chemical vapor deposition (CVD), metal-organic chemical vapor deposition (MOCVD) and atomic layer deposition (ALD), and/or other suitable technique.

The initial structure 205 also includes a dielectric layer 220 deposited over the substrate 210, including over the conductive features 214. The dielectric layer 220 may include silicon oxide, silicon nitride, a dielectric material layer having a dielectric constant (k) lower than thermal silicon oxide (therefore referred to as low-k dielectric material layer), and/or other suitable dielectric material layer. The dielectric layer 220 may include a single layer or multiple layers. The dielectric layer 220 may be deposited by CVD, atomic layer deposition (ALD) or spin-on coating.

Figure 3:
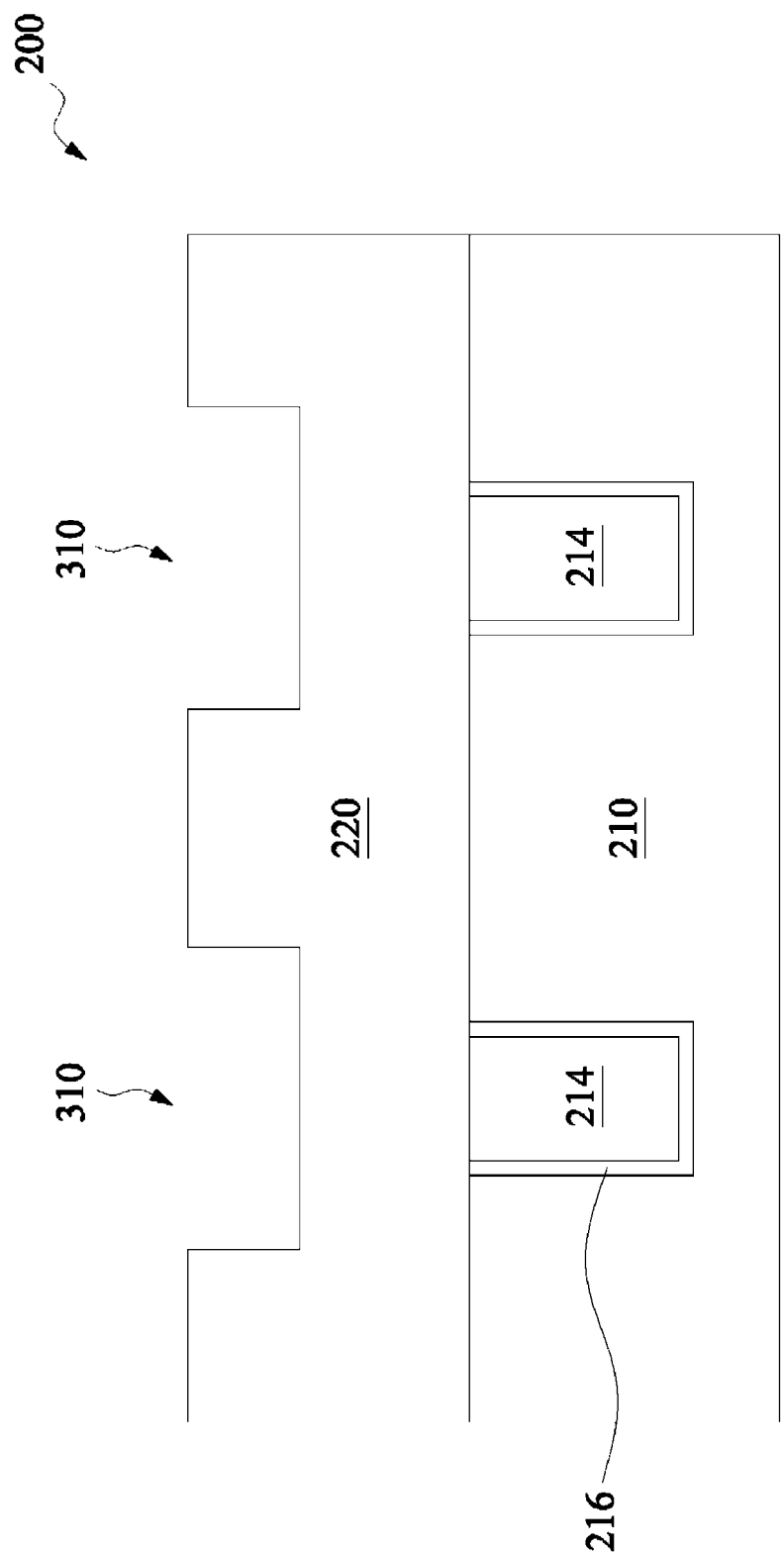
FIGS. 3, 4, 5A, 5B, 6, 7, 8, 9, 10A, 10B, 11 and 12 are cross-sectional views of an exemplary semiconductor device in accordance with some embodiments.

Referring to FIGS. 1 and 3, once the initial structure 205 is received, the method of 100 proceeds to step 104 by removing a portion of the dielectric layer 220 to form trenches 310 in the dielectric layer 220. Trenches 310 are placeholders for conductive lines to be formed therein. Trenches 310 may be formed by a first lithography and etch processes. The first lithography process may include forming a photoresist (or resist) layer over the dielectric layer 220, exposing the resist to a pattern, performing post-exposure bake processes, and developing the resist to form a masking element including the resist. The masking element is then used for etching trenches into the dielectric layer 220. The etching process may include dry etching, wet etching, and/or other suitable processes.

Figure 4:
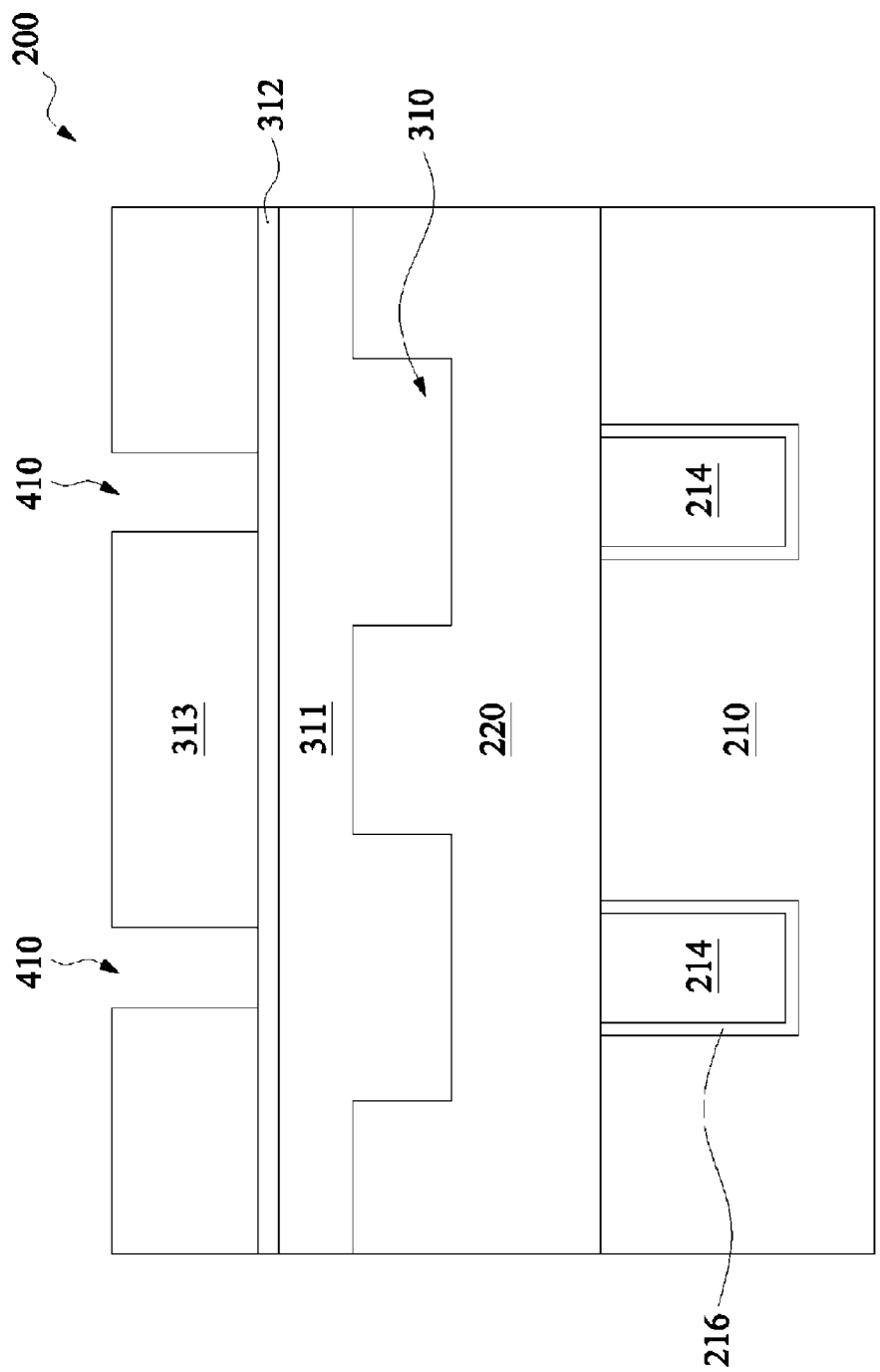

Referring to FIGS. 1 and 4, the method 100 proceeds to step 106 by performing a second lithography process to define via trenches 410 over trenches 310. As shown, illustrated therein is an exemplary lithography process using three layers of material (tri-layer lithography). The three layers are a first material layer referred to as bottom layer (BL) 311, a second material layer referred to as a middle layer (ML) 312, and a third material layer referred to as photoresist 313. The BL layer 311 protects the dielectric layer 220 in a subsequent etch process. In some embodiments, the BL layer 112 includes an organic polymer free of silicon. The ML 312 may include a silicon-containing layer designed to provide etch selectivity from the BL layer 311. In some embodiments, the ML 312 is also designed to function as a bottom anti-reflective coating that reduces reflection during a lithography exposure process, thereby increasing the imaging contrast and enhancing the imaging resolution. The BL 311 fills trenches 310, the ML 312 is formed over the BL 311, and the photoresist 313 is formed over the ML 312. The photoresist 313 is patterned by a photolithography process to provide via trenches 410 therein. As shown, via trenches 410 are aligned with the respective conductive features 214.

Figure 5A:
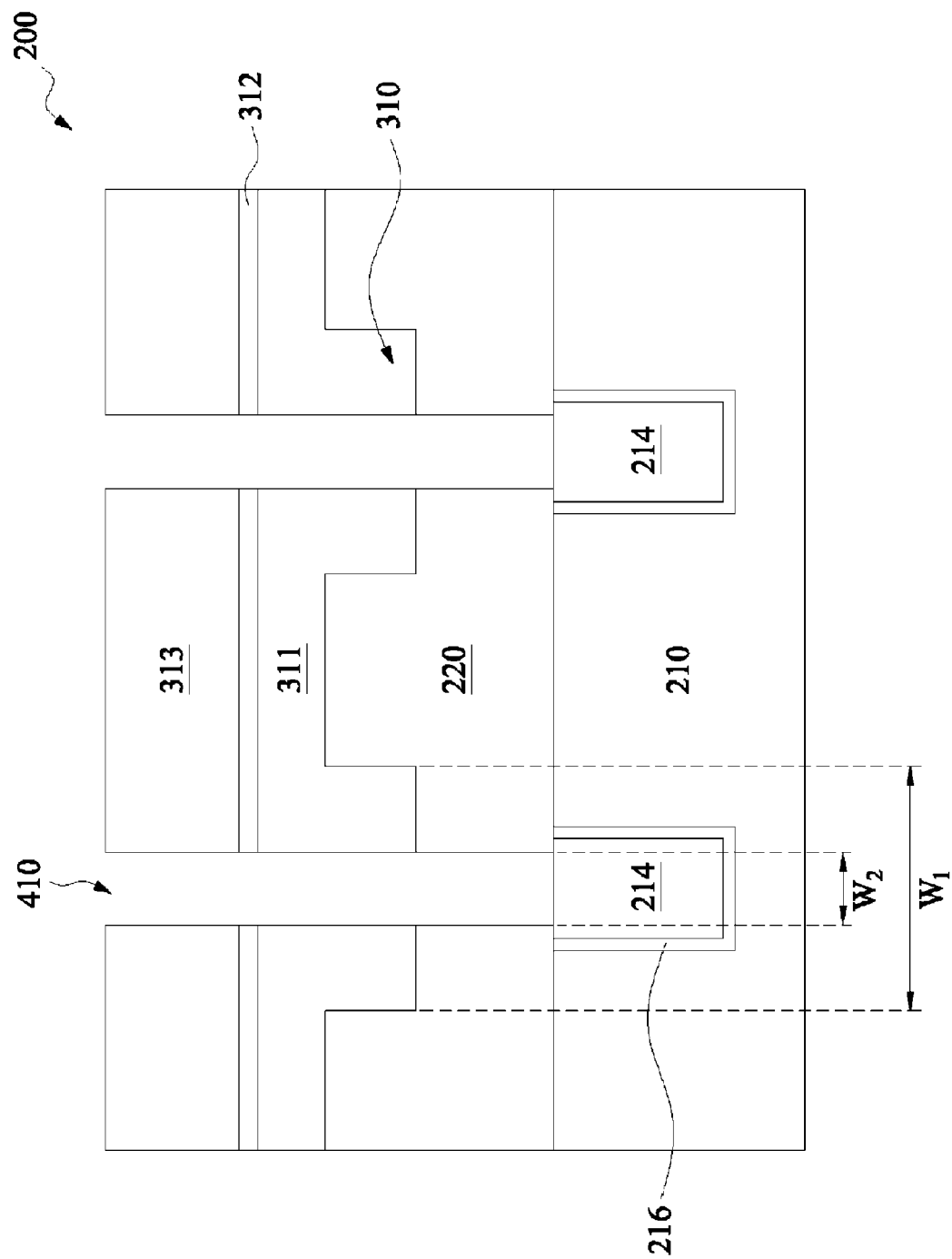

Referring to FIGS. 1 and 5A, the method 100 proceeds to step 108 by extending via trenches 410 through various underlying layers. As shown, the ML 312, the BL 311 and the dielectric layer 220 are etched through via trenches 410 to expose a portion of the conductive feature 214. In the present embodiment, trenches 310 have a first width $w_1$ which is wider than a second width $w_2$ of via trenches 410. The etch process may include a wet etch, a dry etch, and/or a combination thereof. As an example, the etch process includes a plasma dry etching process using a fluorine-based chemistry, such as $CF_4$, $SF_6$, $CH_2F_2$, $CHF_3$, and/or $C_2F_6$. The respective etch process may be tuned with various etching parameters, such as etchant used, etching temperature, etching solution concentration, etching pressure, etchant flow rate, and/or other suitable parameters.

Figure 5B:
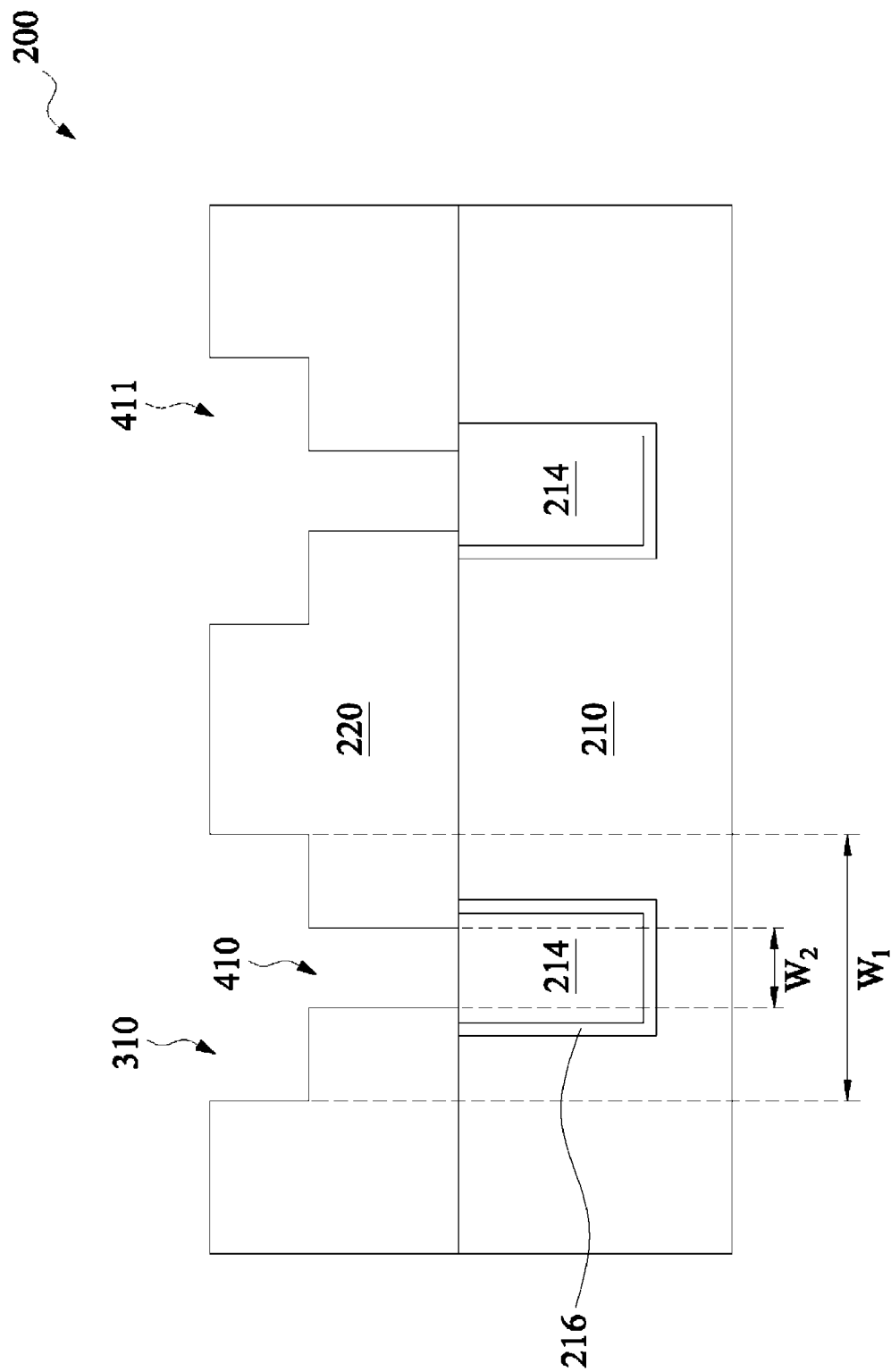

After forming via trenches 410, the remaining portions of photoresist 313, ML 312 and BL 311 are removed by another etch process, such as a wet stripping and/or plasma ashing. As shown in FIG. 5B, after removing the remaining portions of resist 313, ML 312 and BL 311, trenches 310 are revealed and in communication (or connected) with via trenches 410. A portion of the conductive feature 214 is exposed in the respective via trenches 410.

The combination of trench 301 and via trench 410 may be generally referred to as stepped trench (or deep trench) 411. Thus, the deep trench 411 has an upper portion with the first width $w_1$ and a lower portion with the second width $w_2$.

Figure 6:
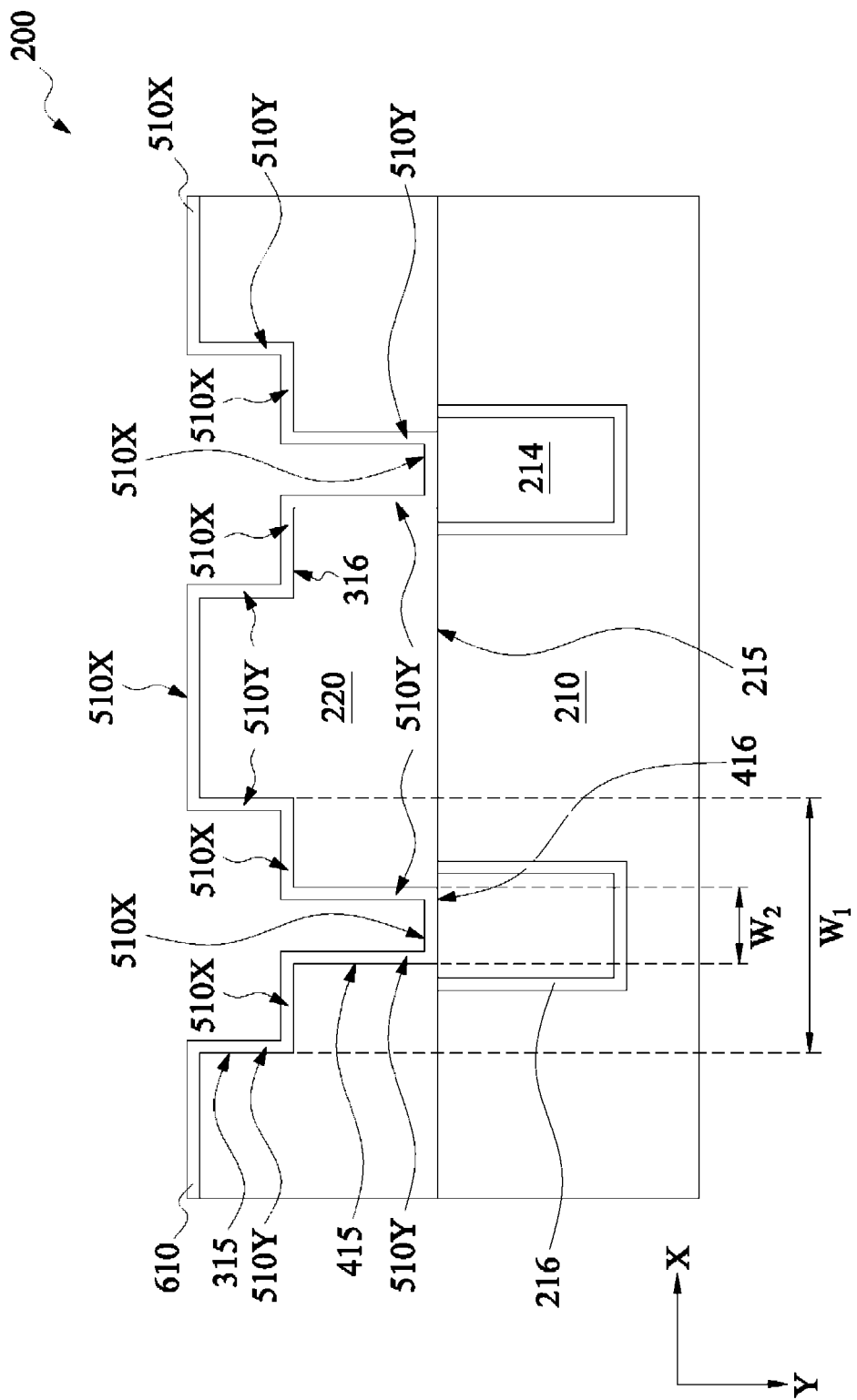

Referring to FIGS. 1 and 6, the method 100 proceeds to step 110 by depositing a first barrier layer 510 in deep trenches 411 (i.e. the combination of via trenches 410 and trenches 310), as well as on the top of the dielectric layer 220. The first barrier layer 510 is chosen to have adequate ability to prevent inter-diffusion and reactions between the dielectric layer 220 and metal layers to be filled in the deep trench 411. The first barrier layer 510 may include tantalum-oxide-nitride (TaON), tantalum nitride (TaN), manganese (Mn), manganese nitride (MnN), titanium (Ti), tantalum (Ta), cobalt (Co), cobalt tungsten (CoW), molybdenum (Mo), and/or other suitable conductive material. The first barrier layer 510 may be deposited by ALD, PVD, CVD, MOCVD, and/or other suitable technique. In some embodiment, the first barrier 510 is deposited by ALD to achieve good step coverage with a quit thin thickness. As an example, the first barrier layer 510 includes a TaON layer deposited by ALD.

In the present embodiment, the first barrier layer 510 is conformably deposited along and physically contacts dielectric layer 220 defining first sidewalls 315 of trenches 310, first bottom 316 of the trenches 310, and second sidewalls 415 of via trenches 410. Additionally, first barrier layer 510 is conformably deposited along and physically contacts conductive feature 214 defining a second bottom 416 of via trenches 410. As a result, first barrier layer 510 includes first portions 510X and second portions 510Y. First portions 510X of the first barrier layer 510 extend in an first direction (i.e. x-direction) which is substantially parallel to a top surface 215 of substrate 210 and second portions Y of the first barrier layer 510 extend in a second direction (i.e. y-direction) that is substantially perpendicular to the first direction.

Figure 7:
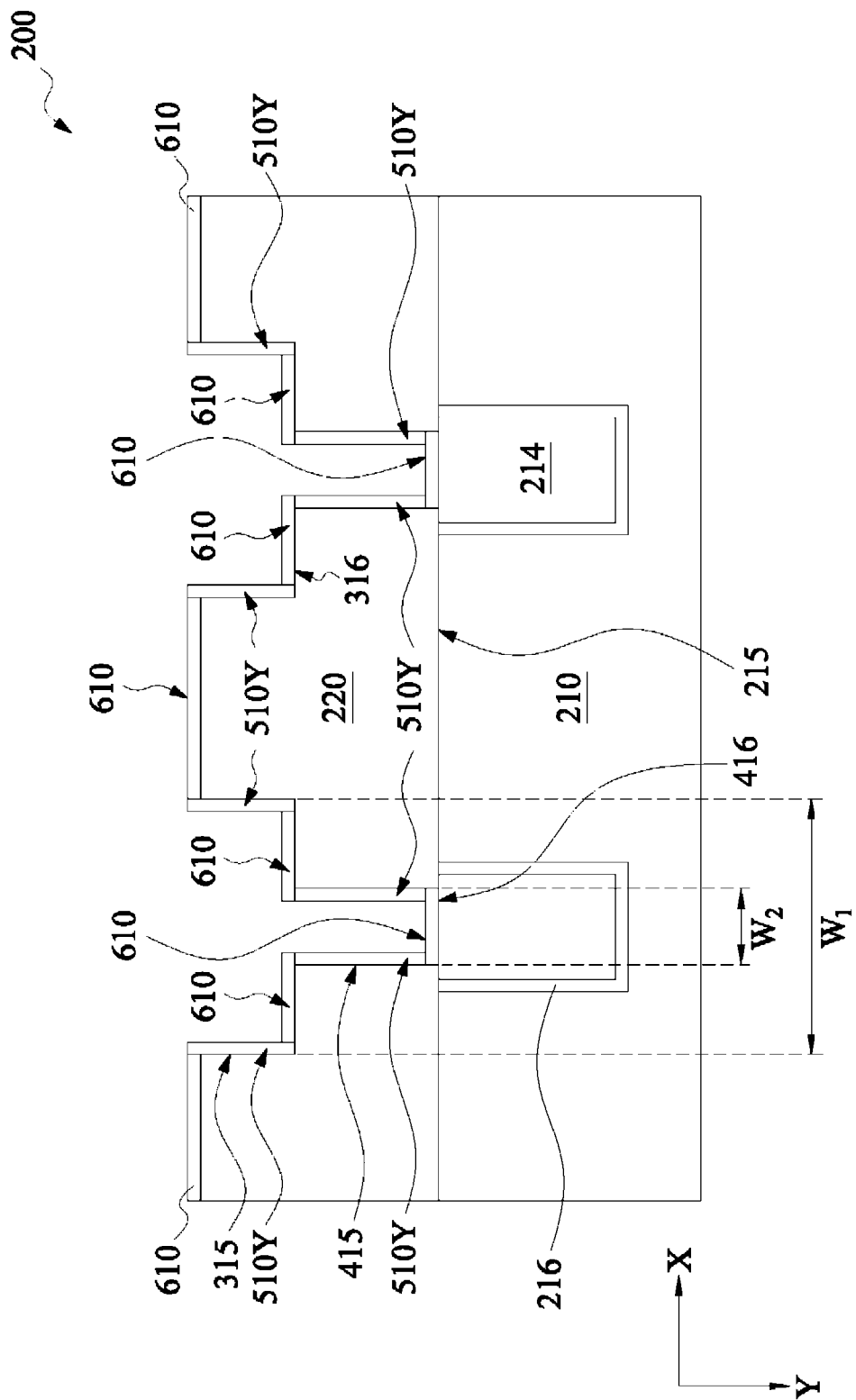

Referring to FIGS. 1 and 7, the method 100 proceeds to step 112 by performing a plasma treatment to transform (or convert) the first portions 510X into a second barrier layer 610 while the second portions 510Y remain intact. In the present embodiment, the second barrier layer 610 has a substantially different etch selectivity comparing with the first barrier layer 510 in a subsequent etch. In one embodiment, an anisotropic (uniformity in vertical direction) plasma treatment along Y-direction is performed to convert the first portions 510X into the second barrier layer 610 while the second portions 510Y remain intact. In one embodiment, barrier layer 510 is formed of TaON and the anisotropic plasma treatment includes using etchant gases of hydrogen and nitrogen ($H_2/N_2$) to convert first portions 510X of TaON barrier layer 510 into a TaN second barrier layer 610 while the second portions 510Y of TaON barrier layer 510 remain intact.

Figure 8:
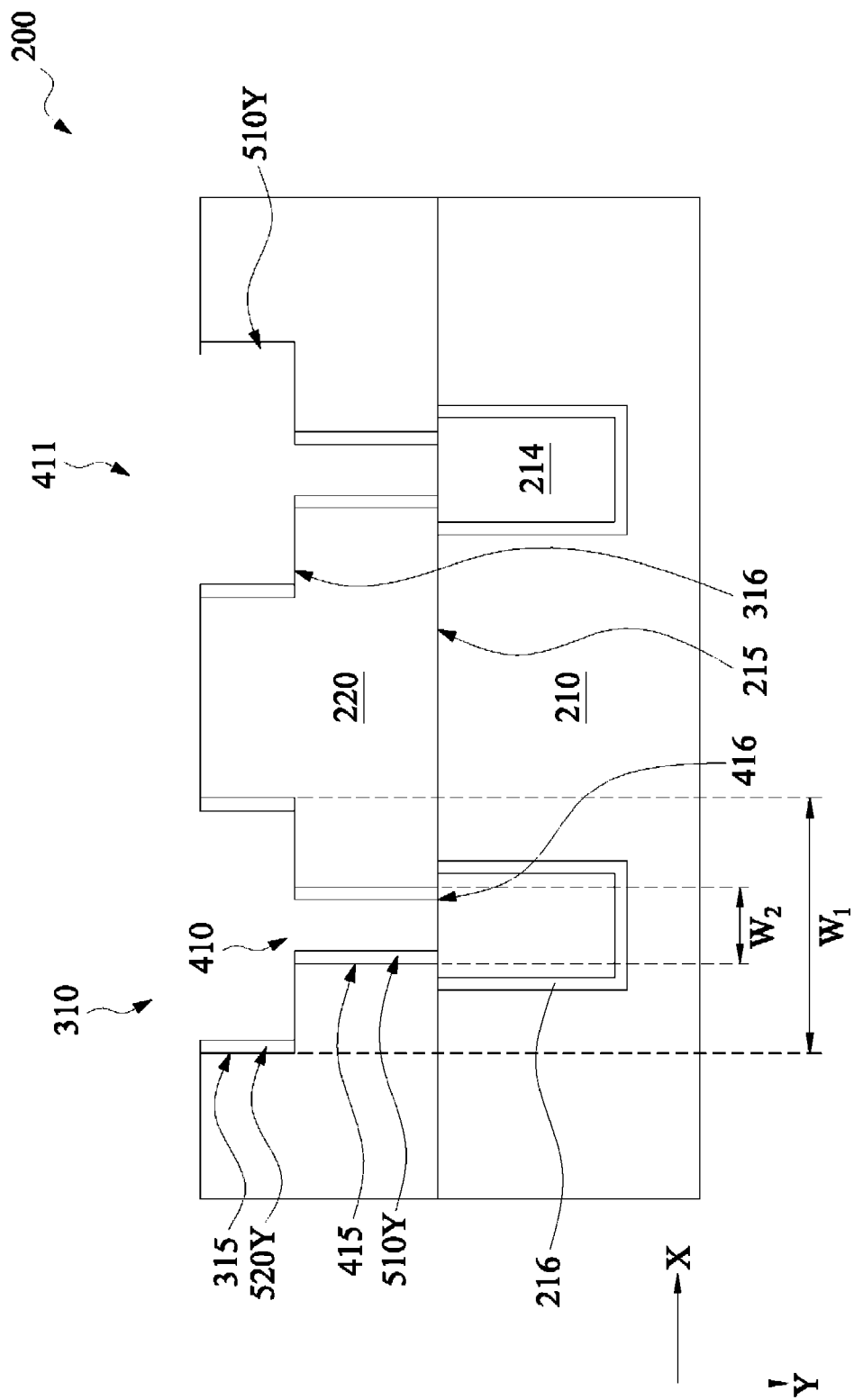

Referring to FIGS. 1 and 8, the method 100 proceeds to step 114 by removing the second barrier layer 610. In the present embodiment, a selective etch is performed such that the etch process etches the second barrier layer 610 without substantially etching the first barrier layer 510 and the conductive feature 214. A selective etch process provides process simplicity and relaxes process constrains. The selective etch may include a selective wet etch, a selective dry etch, and/or a combination thereof. The aqueous wet clean process adds simplicity to the manufacturing process and also minimizes process-induced-damage to the conductive feature 214.

In the present embodiment, after removing the second barrier layer 610, the conductive features 214 are exposed within via trenches 410 and the dielectric layer 220 is exposed within the trench 310 (at the first bottom 316). This removal allows a bottom-barrier-free scheme. This is significant because the resistance of a bottom barrier layer (e.g. the first barrier layer 510) deposited on the bottom of via trenches 410 is usually much higher than a resistance of a metal layer deposited in via trenches 410 over such a bottom barrier layer. Therefore, the resistance of a bottom barrier layer dominates a resistance of a conductive interconnection formed by the combination of the bottom barrier layer and the metal layer. As described below, by allowing a bottom-barrier-free design, the present disclosure provides methods of forming a bottom-barrier-free metal interconnection for achieving low via contact resistance.

Figure 9:
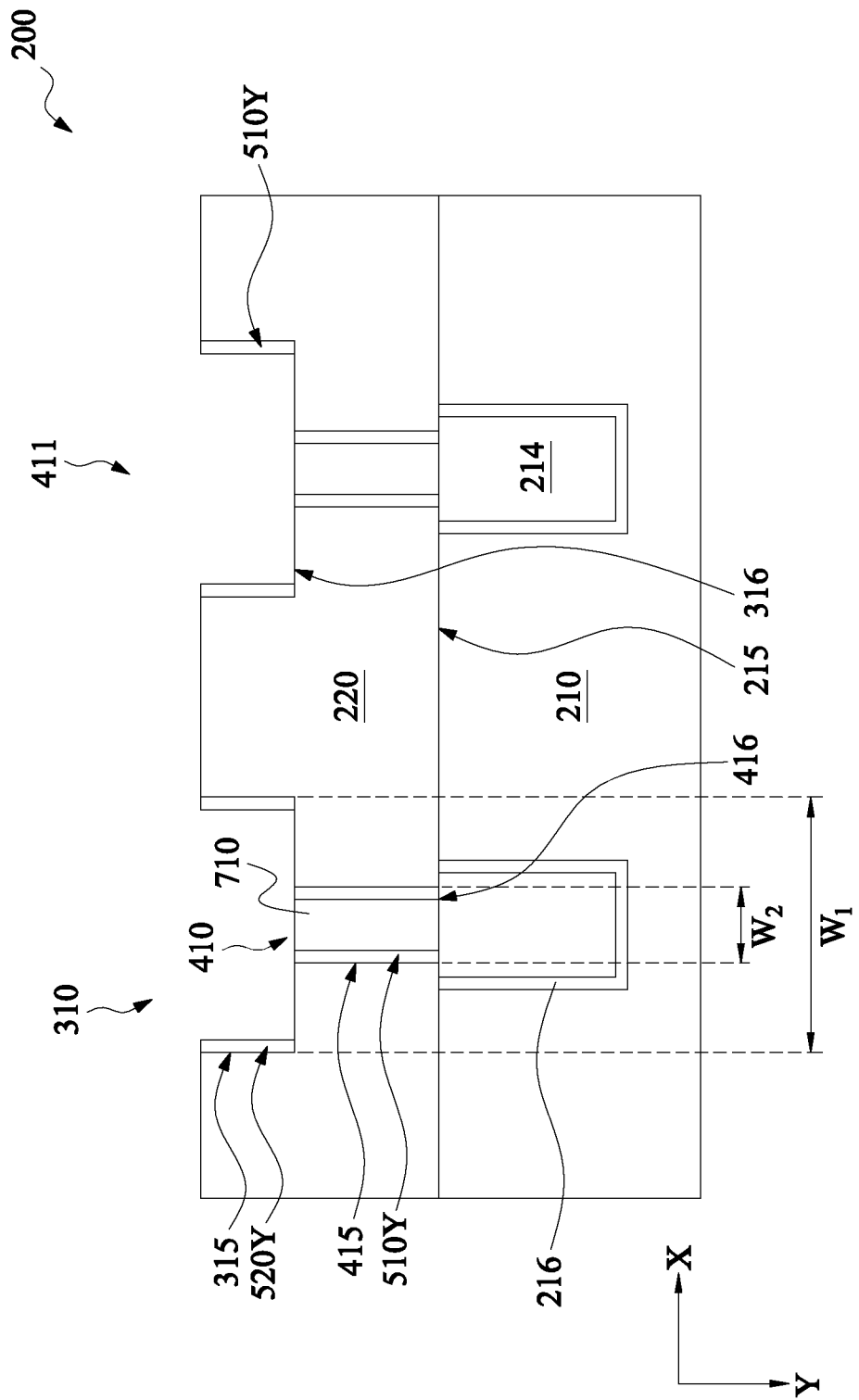

Referring to FIGS. 1 and 9, the method 100 proceeds to step 116 by forming a via metal 710 in via trenches 410. The via metal 710 physically contacts the conductive feature 214. The via metal 710 may include copper and/or copper alloy, such as copper manganese (CuMn), copper aluminum (CuAl), copper titanium, (CuTi), copper vanadium (CuV), copper chromium (CuCr), copper silicon (CuSi) and/or copper niobium (CuNb). The via metal 710 may be formed by PVD, CVD, MOCVD, electroless deposition (ELD), and/or other suitable technique.

In the present embodiment, the via metal 710 is formed by ELD process, which provides an intrinsic process selectivity and conformal bottom-up deposition to reduce via trench gap-fill challenge. In one embodiment, the via metal 710 is Cu deposited by ELD process. As shown, the via metal 710 has the second barrier 610 as its sidewall barrier and thereby it improves device reliability by limiting electron migration (EM) and time-dependent dielectric breakdown (TDDB) associated with via metal diffusion into the underlying dielectric layer 220. Also, by having sidewall barrier layer to enhance prevention for inter-diffusion and reactions between the dielectric layer 220 and the metal layer 710, constrains in choosing candidates for via metal 710 is also relaxed.

Figure 10A:
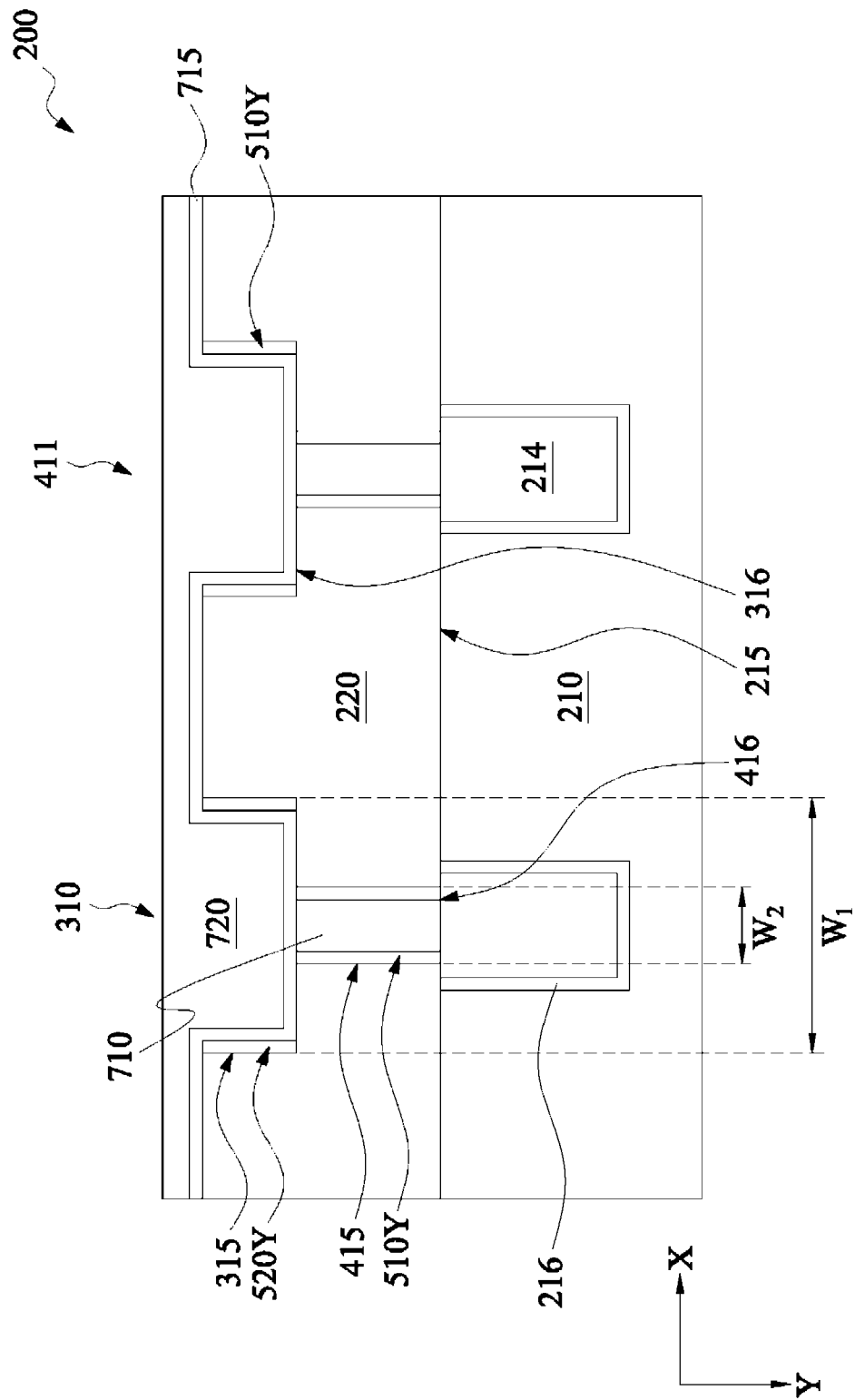

Referring to FIGS. 1 and 10A, the method 100 proceeds to step 118 by filling in trenches 310 with a metal layer 720. In some embodiments, a third barrier layer 715 is deposited in trenches 310, including over the first portions 510Y of barrier layer 510, the dielectric layer 220 at the first bottom 316 and the via metal 710. And then the metal layer 720 is deposited over the third barrier layer 715. The third barrier layer 715 is chosen to have adequate ability to prevent inter-diffusion and reactions between the dielectric layer 220 and the metal layer 720 (especially at the interface between dielectric layer 220 and the metal layer 720 at the first bottom 316) to be filled in trenches 310. The third barrier layer 715 may include Ta, TaN, Mn, MnN, Ti, Ta, Co, CoW, Mo, and/or other suitable conductive material. The third barrier layer 715 may be deposited by ALD, PVD, CVD, MOCVD, and/or other suitable technique.

The metal layer 720 may include Cu, Co, W, Ru, Ag, Au, CoW, CoF, CoSi, and/or other suitable metals. The metal layer 720 (or conductive layer) may be deposited by PVD, CVD, MOCVD, or plating. In one embodiment, the metal layer 720 includes a Cu layer deposited by PVD. In one embodiment, the metal layer 720 includes a Cu layer deposited by plating. In various other examples, Cu deposition may be implemented by other techniques. A Cu reflow process may be added to enhance Cu filling profile.

By forming via metal 710 and the metal layer 720 separately, it provides the benefit of using different deposition processes to better suit the different needs of the via trench 410 and the trench 310. The scheme is sometimes referred to as a via pre-fill scheme. For example, an ELD process is used to form the via metal 710 for its adequate conformal deposition in gap-filling while a PVD process is used to fill in the trench 310, which has a wider gap, for its higher deposition rate and lower process cost compared to the ELD process.

Figure 10B:
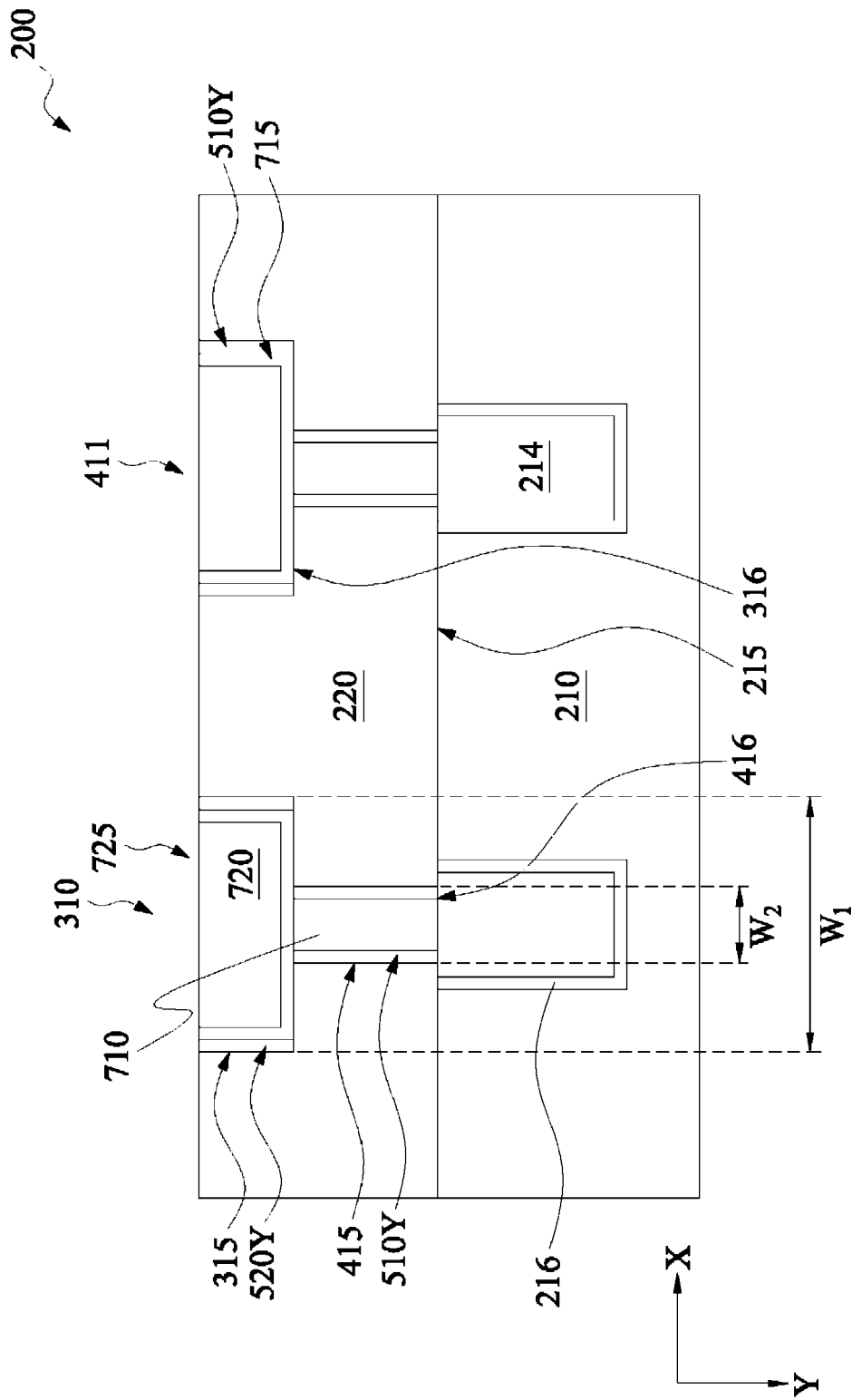

Additionally, a chemical mechanical polishing (CMP) process is performed to planarize the top surface of the device 200 to remove excessive metal layer 720 and the third barrier layer 715 over the dielectric layer 220, as shown in FIG. 10B. The third barrier layer 715 and metal layer 720 in trenches 310 forming the conductive lines 725. As shown, the first portions 510Y of first barrier layer 510 are disposed along sidewalls of the via metal 710. Additionally, the third barrier layer 715 is disposed along sidewalls of the metal layer 720. The third barrier layer 715 is also disposed between the via metal 710 and metal layer 720. Furthermore, the third barrier layer 715 is disposed over the dielectric layer 220 along the first bottom 316 of the trench 310. Furthermore, first portions 510Y of first barrier layer 510 are disposed along sidewalls of the metal layer 720.

Additional steps can be provided before, during, and after the method 100, and some of the steps described can be replaced, eliminated, or moved around for additional embodiments of the method 100.

Figure 11:
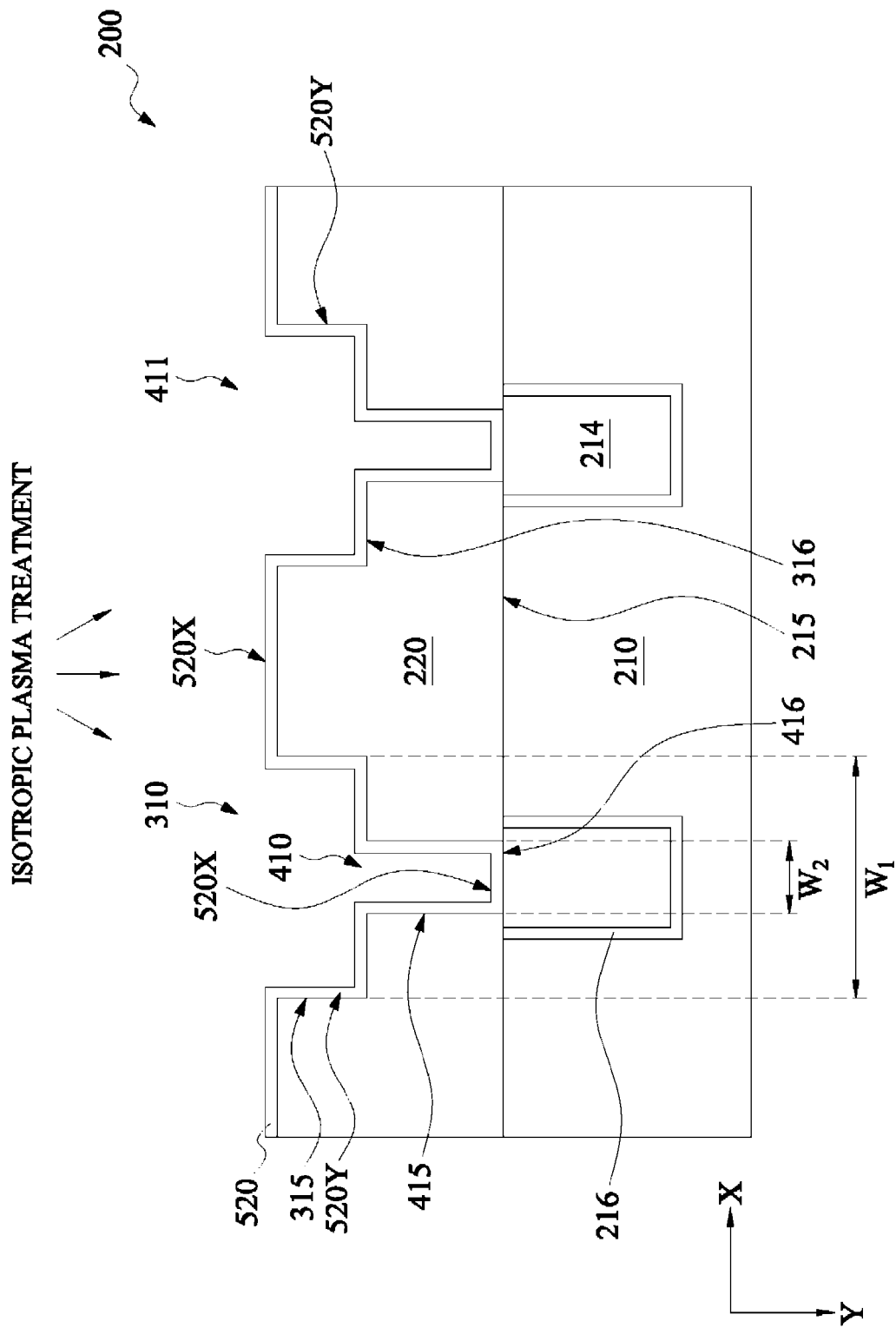

In an alternative embodiment, after forming the first barrier layer 510 in deep trenches 411 (i.e. the combination of via trenches 410 and trenches 310) in step 110, an isotropic (i.e. uniformity in all directions) plasma treatment may be performed to convert the first barrier 510 into a modified (or another) barrier layer 520, as shown in FIG. 11. The modified barrier layer 520 includes first portions 520X and second portions 520Y. First portions 520X of the modified barrier layer 520 extend in an first direction (i.e. x-direction) which is substantially parallel to the top surface 215 of substrate 210 and second portions 520Y of the second barrier layer 510 extend in a second direction (i.e. y-direction) that is substantially perpendicular to the first direction. In one embodiment, barrier layer 510 is formed of TaN and the isotropic plasma treatment includes using etchant gases of hydrogen and oxygen ($H_2/O_2$) to convert TaN barrier layer 510 into a TaON second barrier layer 520.

Figure 12:
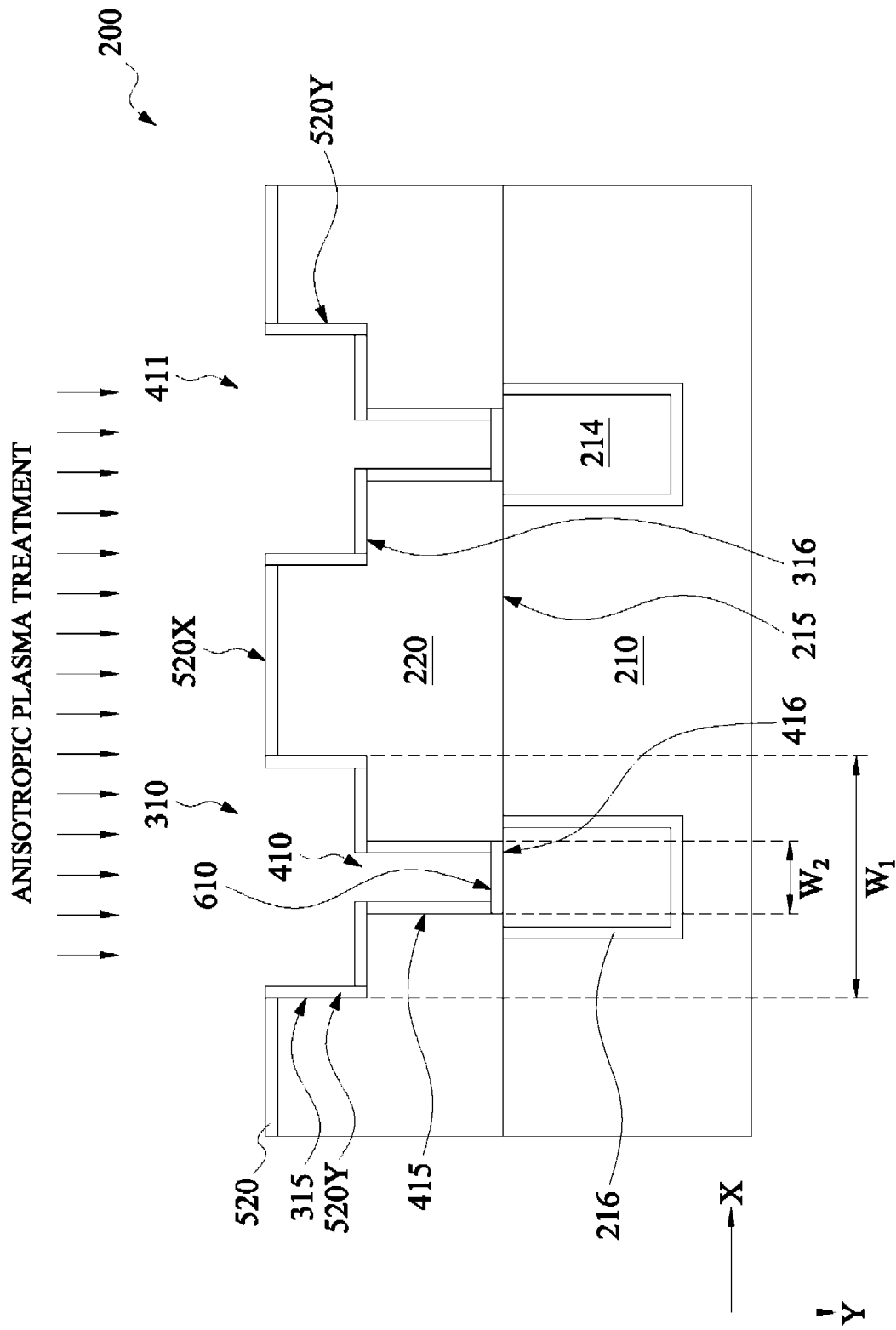

After forming the modified barrier layer 520, the method 100 continues to step 112 by applying a plasma treatment to transform (or convert) the first portions 520X into a second barrier layer 610 while the second portions 520Y remain intact, as show in FIG. 12. As discussed above, an anisotropic (i.e. uniformity in a vertical direction) plasma treatment along Y-direction is performed to convert the first portions 520X into the second barrier layer 610 while the second portions 520Y remain intact. In one embodiment, modified barrier layer 520 is formed of TaON and the anisotropic plasma treatment includes using etchant gases of hydrogen and nitrogen ($H_2/N_2$) to convert the TaON first portions 520X of modified barrier layer 520 into a TaN second barrier layer 610 while the second portions 520Y of TaON modified barrier layer 520 remain intact. Thereafter, this alternative embodiment continues with the remaining steps of method 100 as discussed above.

The semiconductor devices 200 may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, it can be seen that the present disclosure provide methods of forming a bottom-barrier-free metal interconnection for achieving low via contact resistance. The method provides sidewall barrier for ELD via metal to improve TDDB and electron migration (EM). The method employs an anisotropic plasma treatment to convert a bottom barrier layer into a different barrier layer to gain an etch selectivity to remove it in subsequent etch process. The method provides a robust metal interconnection formation process with selective etch to relax process constrains and simplify the manufacturing process.

The present disclosure provides many different embodiments of fabricating a semiconductor device that provide one or more improvements over existing approaches. In one embodiment, a method for fabricating a semiconductor device includes forming a dielectric layer over a substrate, forming a trench in the dielectric layer, forming a first barrier layer in the trench. The first barrier layer has a first portion disposed along sidewalls of the trench and a second portion disposed over a bottom of the trench. The method also includes applying an anisotropic plasma treatment to convert the second portion of the first barrier layer into a second barrier layer, removing the second barrier layer while the first portion of the first barrier layer is disposed along sidewalls of the trench. The method also includes forming a conductive feature in the trench.

In yet another embodiment, a method includes forming a dielectric layer over a first conductive feature disposed on a substrate, forming a trench in the dielectric layer. The trench has a first width in its upper portion and a second width in its lower portion. The first width is greater than the second width. The first conductive feature is exposed within the trench. The method also includes forming a first barrier layer in the trench, which has a first portion of the first barrier formed along a sidewall surface of the trench defined by the dielectric layer and a second portion of the first barrier layer formed along a first bottom surface of the upper portion of the trench and a second bottom surface of the lower portion of the trench defined by the first conductive feature. The method also includes applying an anisotropic plasma treatment to convert the second portion of the first barrier layer into a second barrier layer. The second barrier layer is formed of a different material than the first barrier layer. The method also includes removing the second barrier layer while the first portion of the first barrier layer is disposed along sidewalls of the trench. The method also includes forming a second conductive feature in the trench.

In yet another embodiment, a semiconductor device includes a first conductive feature disposed over a substrate and a second conductive feature disposed over the first conductive feature. The second conductive feature has an upper portion having a first width and a lower portion having a second width that is different than the first width; wherein the lower portion is in physical contact with a top portion of the first conductive feature. The device also includes a first barrier layer disposed along sidewalls of the second conductive feature, a second barrier layer disposed between the upper portion and lower portion of the second conductive feature and extends along a bottom of the upper portion of the second conductive feature. The device also includes a dielectric layer disposed around the second conductive feature. The dielectric layer is in physical contact with a side of the first barrier layer that faces away from the lower portion of the second conductive feature. It is also in physical contact with a side of the second barrier layer that faces away from the upper portion of the second conductive feature. It is also in physical contact with a portion of a bottom surface of the upper portion of the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a dielectric layer over a substrate;
   forming a trench in the dielectric layer;
   forming a first barrier layer in the trench, wherein the first barrier layer has a first portion disposed along sidewalls of the trench and a second portion disposed over a bottom of the trench, and wherein the first barrier layer is formed of a first conductive material;

applying an isotropic plasma treatment to convert the first barrier layer into a modified barrier layer formed of a second conductive material different than that first conductive material, wherein the modified barrier layer has a first modified portion disposed along sidewalls of the trench and a second modified portion disposed over a bottom of the trench;

applying an anisotropic plasma treatment to convert the second modified portion of the modified barrier layer into a second barrier layer, the second barrier layer being formed of the same first conductive material as the first barrier layer;

removing the second barrier layer while the first modified portion of the modified barrier layer is disposed along sidewalls of the trench; and forming a conductive feature in the trench.

2. The method of claim 1, wherein the forming of the trench in the dielectric layer includes forming an upper portion of the trench by a first process and a lower portion of the trench by a second process, wherein a width of the upper portion is greater than a width of the lower portion.

3. The method of claim 2, wherein the forming of the conductive feature in the trench includes depositing a first copper layer by electroless deposition (ELD) in the lower portion of the trench.

4. The method of claim 3, wherein the forming of the conductive feature in the trench includes:
   depositing a third barrier layer in the trench, including over the first copper layer; and
   depositing a second copper layer by a non-ELD process over the third barrier layer in the upper portion of the trench.

5. The method of claim 1, wherein the second modified portion of the modified barrier layer is formed of TaON, and
   wherein the applying of the anisotropic plasma treatment to convert the second modified portion of the modified barrier layer into the second barrier layer includes applying the anisotropic plasma treatment with etchant gases of hydrogen and nitrogen ($H_2/N_2$) to convert the second modified portion of the modified barrier layer into a TaN barrier layer.

6. The method of claim 5, wherein the removing of the second barrier layer while the first modified portion of the modified barrier layer is disposed along sidewalls of the trench includes removing the TaN layer by performing a wet etch process that includes an acid.

7. The method of claim 1, further comprising forming another conductive feature over the substrate, wherein the another conductive feature physically contacts the conductive feature.

8. The method of claim 1, wherein the first barrier layer is formed of tantalum nitride (TaN),
   wherein the applying of the isotropic plasma treatment to convert the first barrier layer into the modified barrier layer includes applying the isotropic plasma treatment with etchant gases of hydrogen and oxygen ($H_2/O_2$) to convert the first barrier layer formed of TaN barrier layer into the modified barrier layer formed of tantalum-oxide-nitride (TaON) barrier layer, and
   wherein the applying of the anisotropic plasma treatment to convert the second modified portion of the modified barrier layer into the second barrier layer includes applying the anisotropic plasma treatment with etchant gases of hydrogen and nitrogen ($H_2/N_2$) to convert the second portion of the first barrier layer into a TaN barrier layer.

9. A method comprising:
   forming a dielectric layer over a first conductive feature disposed on a substrate;
   forming a trench in the dielectric layer, wherein the trench has a first width in its upper portion and a second width in its lower portion, wherein the first width is greater than the second width, wherein the first conductive feature is exposed within the trench;
   forming a first barrier layer in the trench, wherein a first portion of the first barrier is formed along a sidewall surface of the trench defined by the dielectric layer and a second portion of the first barrier layer is formed along a first bottom surface of the upper portion of the trench and a second bottom surface of the lower portion of the trench defined by the first conductive feature, and wherein the first barrier layer is formed of a first conductive material;
   applying an isotropic plasma treatment to convert the first barrier layer to a modified barrier layer formed of a second conductive material different than that first conductive material, wherein a first portion of the modified barrier is formed along a sidewall surface of the trench defined by the dielectric layer and a second portion of the modified barrier layer is formed along the first bottom surface of the upper portion of the trench and the second bottom surface of the lower portion of the trench defined by the first conductive feature;
   applying an anisotropic plasma treatment to convert the second portion of the modified barrier layer into a second barrier layer, wherein the second barrier layer is formed of the same first conductive material as the first barrier layer;
   removing the second barrier layer while the first portion of the modified barrier layer is disposed along sidewalls of the trench; and
   forming a second conductive feature in the trench.

10. The method of claim 9, wherein the forming of the second conductive feature in the trench includes depositing a first copper layer by electroless deposition (ELD) in the lower portion of the trench.

11. The method of claim 10, wherein the forming of the second conductive feature in the trench further includes:
    depositing a third barrier layer in the trench, including over the first copper layer; and
    depositing a second copper layer by a non-ELD process over the third barrier layer in the upper portion of the trench.

12. The method of claim 9, wherein the applying of the anisotropic plasma treatment to convert the second portion of the modified barrier layer to the second barrier layer includes applying an anisotropic plasma treatment with etchant gases of hydrogen and nitrogen ($H_2/N_2$) to convert the second conductive material into the first conductive material wherein the first conductive material is tantalum nitride (TaN) and the second conductive material is tantalum-oxide-nitride (TaON).

13. The method of claim 12, wherein the removing of the second barrier layer while the first portion of the modified barrier layer is disposed along sidewalls of the trench includes removing the first conductive material by performing a wet etch process that includes an acid.

14. The method of claim 9, wherein an isotropic plasma treatment with etchant gases of hydrogen and oxygen ($H_2/O_2$) is applied to convert the first conductive material into the second conductive material, wherein the first conductive material is tantalum nitride (TaN) and the second conductive material is tantalum-oxide-nitride (TaON).

15. The method of claim 9, wherein the forming of the trench in the dielectric layer includes:
    forming a first sub-trench having the first width in an upper portion of the dielectric layer;
    forming a patterned hard mask having an opening with the second width over the sub-trench, wherein the opening aligns to the first conductive feature; and
    etching the dielectric layer through the opening to extend the sub-trench through the dielectric layer.

16. A method comprising:
    forming a dielectric layer over a substrate;
    forming a trench in the dielectric layer, wherein the trench has an upper portion having a first width and a lower portion having a second width that is smaller than the first width;
    forming a barrier layer in the trench, wherein the barrier layer is formed of a first conductive material;
    performing a first treatment process on a first portion of the barrier layer and a second portion of the barrier layer, wherein the first treatment process converts the first conductive material into a second conductive material different than the first conductive material;
    performing a second treatment process on the treated first portion of the barrier layer, wherein performing the second treatment process avoids treating the treated second portion of the barrier layer, and wherein the second treatment process converts the second conductive material into the first conductive material;
    removing the treated first portion of the barrier layer after performing the second treatment process on the treated first portion of the barrier layer; and
    forming a third conductive material on the treated second portion of the barrier layer.

17. The method of claim 16, wherein the performing of the first treatment process includes performing an isotropic plasma treatment process, and
    wherein performing the second treatment process includes performing an anisotropic plasma treatment.

18. The method of claim 16, wherein the first portion of the barrier layer extends along the dielectric layer defining the upper portion of the trench.

* * * * *